United States Patent
Zartarian et al.

(10) Patent No.: US 9,510,068 B2
(45) Date of Patent: Nov. 29, 2016

(54) AUTOMATIC EQUALIZATION OF LOUDSPEAKER ARRAY

(71) Applicant: Bose Corporation, Framingham, MA (US)

(72) Inventors: Michael G. Zartarian, Belmont, MA (US); Peter C. Santoro, Groton, MA (US); Michael Arthur Siegel, Somerville, MA (US)

(73) Assignee: Bose Corporation, Framingham, MA (US)

( * ) Notice: Subject to any disclaimer, the term of this patent is extended or adjusted under 35 U.S.C. 154(b) by 347 days.

(21) Appl. No.: 14/246,686

(22) Filed: Apr. 7, 2014

(65) Prior Publication Data

US 2015/0289038 A1 Oct. 8, 2015

(51) Int. Cl.

| H03G 5/00 | (2006.01) |
|---|---|
| H04R 1/00 | (2006.01) |
| H03G 3/20 | (2006.01) |
| H04R 3/04 | (2006.01) |
| H04R 1/40 | (2006.01) |
| H04R 27/00 | (2006.01) |

(52) U.S. Cl.
CPC .................. *H04R 1/00* (2013.01); *H03G 3/20* (2013.01); *H04R 3/04* (2013.01); *H04R 1/403* (2013.01); *H04R 27/00* (2013.01); *H04R 2201/025* (2013.01); *H04R 2201/403* (2013.01)

(58) Field of Classification Search
CPC ........ H04R 1/00; H04R 3/054; H04R 1/403; H04R 27/00; H04R 2201/025; H03G 3/20
USPC ....................................... 381/103
See application file for complete search history.

(56) References Cited

U.S. PATENT DOCUMENTS

| 3,449,519 A | 6/1969 | Mowry |
| 4,054,750 A | 10/1977 | Montgomery et al. |
| 5,784,468 A | 7/1998 | Klayman |
| 6,628,999 B1 * | 9/2003 | Klaas ..................... H04H 60/04 |
| | | 381/104 |
| 6,652,046 B2 | 11/2003 | Christner |
| 6,925,880 B1 * | 8/2005 | Roberts .................. G01N 29/12 |
| | | 381/58 |
| 6,996,243 B2 | 2/2006 | Welker et al. |
| 7,092,541 B1 | 8/2006 | Eberbach |

(Continued)

FOREIGN PATENT DOCUMENTS

| DE | 102008059036 A1 | 5/2010 |
| EP | 1686830 A1 | 8/2006 |
| JP | 2007181098 A | 7/2007 |

OTHER PUBLICATIONS

International Search Report and Written Opinion dated Sep. 10, 2012 for PCT/US2012/033437.

(Continued)

*Primary Examiner* — Creighton Smith
(74) *Attorney, Agent, or Firm* — Bose Corporation

(57) ABSTRACT

A loudspeaker includes a plurality of electro-acoustic drivers that are configured to be positioned so that an axis running through an acoustic center of the drivers is one of a substantially straight line, J-shape, reverse J-shape, and C-shape. The loudspeaker also includes at least one sensor to detect a configuration of the plurality of electro-acoustic drivers, and a processing device configured to automatically adjust one or more of an equalization and a gain applied to an audio signal output through the electro-acoustic drivers based on the detected configuration.

25 Claims, 9 Drawing Sheets

(56) References Cited

U.S. PATENT DOCUMENTS

| | | | |
|---|---|---|---|
| 7,346,315 | B2 | 3/2008 | Zurek et al. |
| 7,706,558 | B2 | 4/2010 | Sack et al. |
| 7,724,892 | B2 | 5/2010 | Dedieu et al. |
| 8,139,774 | B2 | 3/2012 | Berardi et al. |
| 8,265,310 | B2 | 9/2012 | Berardi et al. |
| 8,310,458 | B2 | 11/2012 | Faubert et al. |
| 8,340,315 | B2 | 12/2012 | Kantola |
| 8,351,630 | B2 | 1/2013 | Ickler et al. |
| 2001/0011993 | A1 | 8/2001 | Saarinen |
| 2003/0179899 | A1 | 9/2003 | Welker et al. |
| 2004/0245043 | A1 | 12/2004 | Noselli et al. |
| 2005/0063559 | A1 | 3/2005 | Lee et al. |
| 2008/0273713 | A1* | 11/2008 | Hartung ............... H04R 5/02 381/86 |
| 2009/0238372 | A1 | 9/2009 | Hsu |
| 2009/0274329 | A1 | 11/2009 | Ickler et al. |
| 2009/0279721 | A1 | 11/2009 | Tanaka |
| 2010/0246839 | A1 | 9/2010 | Thompson |
| 2010/0322445 | A1 | 12/2010 | Jakowski |
| 2011/0026744 | A1 | 2/2011 | Jankovsky et al. |
| 2011/0216924 | A1 | 9/2011 | Berardi et al. |
| 2012/0263324 | A1 | 10/2012 | Joyce et al. |
| 2012/0263325 | A1 | 10/2012 | Freeman et al. |
| 2012/0263335 | A1 | 10/2012 | Breen et al. |
| 2015/0281866 | A1* | 10/2015 | Williams ............... H04R 1/026 381/56 |
| 2015/0289038 | A1* | 10/2015 | Zartarian ............... H04R 3/04 381/103 |

OTHER PUBLICATIONS

Invitation to Pay Additional Fees dated Jul. 6, 2012 for PCT/2012/033437.

International Search Report and Written Opinion dated Jul. 2, 2015 for PCT/US2015/024678.

Thompson et al: "Improved Methods for Controlling Touring Loudspeaker Arrays", AES Convention 127; Oct. 2009, AES, 60 East 42nd Street, Room 2520 New York 10165-2520, USA, Oct. 1, 2009 (Oct. 1, 2009), XP040509110, section 1; p. 1-p. 2 sections 2 to 4; p. 2-p. 4; figure 1 sections 6 to 9; p. 4-p. 11; figures 5-8.

Anonymous: "Matlab—Question about overlap-add—Signal Processing Stack Exchange", Apr. 16, 2013 (Apr. 16, 2013), XP055197231, Retrieved from the Internet: URL: http://dsp.stackexchange.com/questions/8661/question-about-overlap-add [retrieved on Jun. 22, 2015] the whole document.

Anonymous: "Signal processing—Overlap add in audio analysis-synthesis—Stack Overflow", Mar. 11, 2014 (Mar. 11, 2014), XP055197232, Retrieved from the Internet: URL:http://stackoverflow.com/questions/22207194/overlap-add-in-audio-analysis-synthesis [retrieved on Jun. 22, 2015] the whole document.

* cited by examiner

AUTOMATIC EQUALIZATION OF LOUDSPEAKER ARRAY

BACKGROUND

This disclosure relates to line array loudspeakers.

Various devices have been used to control sound dispersion from loudspeaker systems. One method is to use multiple loudspeaker drivers arranged in a line source or array. A typical line array loudspeaker system includes a plurality of loudspeaker drivers arranged in a line in one or more enclosures. A line array system in which the drivers are oriented in a straight line may produce a directivity response that is too narrow vertically for some venues. For example, in venues where listeners are situated on multiple horizontal planes, a line array system in which the drivers are oriented in a straight line may have a directivity pattern that reaches only some of the audience. Thus, depending on a listener's location in a venue, intelligibility and listening ease may suffer.

SUMMARY

In general, in some aspects, a loudspeaker includes a plurality of electro-acoustic drivers that are configured to be positioned so that an axis running through an acoustic center of the drivers is one of a substantially straight line, J-shape, reverse J-shape, and C-shape. The loudspeaker also includes at least one sensor to detect a configuration of the plurality of electro-acoustic drivers, and a processing device configured to automatically adjust one or more of an equalization and a gain applied to an audio signal output through the electro-acoustic drivers based on the detected configuration.

Implementations may include any, all or none of the following features. The processing device may be configured to adjust the equalization by crossfading a first set of filter parameters to a second set of filter parameters over a predetermined period of time. The processing device may be configured to automatically adjust both an equalization and a gain applied to the audio signal based on the detected configuration. The processing device may be configured to adjust the gain by crossfading a first gain to a second gain over a predetermined period of time.

The acoustic center of each electro-acoustic driver may be the center of a dust cap disposed on each electro-acoustic driver.

The at least one sensor may comprise at least one of: an infrared sensor, photoelectric sensor, magnetic sensor, capacitive sensor, inductive sensor, Reed sensor, Hall effect sensor, and contact switch.

The equalization applied to the audio signal may be predetermined based on a configuration of the electro-acoustic drivers. The equalization applied to the audio signal may be determined based on an acoustic measurement of the frequency response of the loudspeaker.

The equalization and gain may be automatically adjusted so that the audio signal sounds substantially the same regardless of the configuration of the electro-acoustic drivers.

In general, in some aspects, a loudspeaker system includes a first loudspeaker array. The first loudspeaker array includes a first housing, a first plurality of electro-acoustic drivers disposed in the first housing, at least one sensor disposed in the first housing, and a first processing device. The first plurality of electro-acoustic drivers is configured to be positioned so that an axis running through an acoustic center of the electro-acoustic drivers is one of a substantially straight line, J-shape, reverse J-shape, and C-shape. The at least one sensor detects a configuration of the first plurality of electro-acoustic drivers. The first processing device is configured to automatically adjust one or more of an equalization and a gain applied to an audio signal output through the first plurality of electro-acoustic drivers based on the detected configuration.

Implementations may include any, all or none of the following features. The first processing device may be configured to adjust the equalization by crossfading a first set of filter parameters to a second set of filter parameters over a predetermined period of time. The first processing device may be further configured to automatically adjust both an equalization and a gain applied to the audio signal based on the detected configuration. The first processing device may be configured to adjust the gain by crossfading a first gain to a second gain over a predetermined period of time.

The acoustic center of each electro-acoustic driver may be the center of a dust cap disposed on each electro-acoustic driver.

The at least one sensor disposed in the first housing may comprise at least one of: an infrared sensor, photoelectric sensor, magnetic sensor, capacitive sensor, inductive sensor, Reed sensor, Hall effect sensor, and contact switch.

The equalization applied to the audio signal may be predetermined based on a configuration of the electro-acoustic drivers. The equalization applied to the audio signal may be determined based on an acoustic measurement of the frequency response of the loudspeaker.

The equalization and gain may be automatically adjusted so that the audio signal sounds substantially the same regardless of the configuration of the electro-acoustic drivers.

The loudspeaker system may further include a second loudspeaker array.

The second loudspeaker array may include a second housing, a second plurality of electro-acoustic drivers disposed in the second housing, at least one sensor disposed in the second housing, and a second processing device. The second plurality of electro-acoustic drivers is configured to be positioned so that an axis running through an acoustic center of the electro-acoustic drivers is one of a substantially straight line, J-shape, reverse J-shape, and C-shape. The at least one sensor disposed in the second housing detects a configuration of the second plurality of electro-acoustic drivers. The second processing device is configured to automatically adjust one or more of an equalization and a gain applied to an audio signal output through the second plurality of electro-acoustic drivers based on the detected configuration. The second loudspeaker array is configured to be attached to the first loudspeaker array in a manner that extends the height of the loudspeaker system while the width remains substantially the same.

In general, in some aspects, a method includes providing a plurality of electro-acoustic drivers configured to be positioned so that an axis running through an acoustic center of the electro-acoustic drivers is one of a substantially straight line, J-shape, reverse J-shape, and C-shape. The method further includes detecting a configuration of the plurality of electro-acoustic drivers. The method further includes automatically adjusting one or more of an equalization and a gain applied to an audio signal output through the plurality of electro-acoustic drivers based on the detected configuration.

Implementations may include any, all or none of the following features. Automatically adjusting the equalization may comprise crossfading a first set of filter parameters to a second set of filter parameters over a predetermined period of time. Automatically adjusting the gain may comprise crossfading a first gain to a second gain over a predetermined period of time.

The method may further include automatically adjusting both the equalization and the gain applied to the audio signal based on the detected configuration.

Detecting a configuration may use at least one of: an infrared sensor, photoelectric sensor, magnetic sensor, capacitive sensor, inductive sensor, Reed sensor, Hall effect sensor, and contact switch.

The equalization and gain may be automatically adjusted so that the audio signal sounds substantially the same regardless of the configuration of the electro-acoustic drivers.

Implementations may include one of the above and/or below features, or any combination thereof. Other features and advantages will be apparent from the description and the claims.

BRIEF DESCRIPTION OF THE DRAWINGS

For purposes of illustration some elements are omitted and some dimensions are exaggerated.

DETAILED DESCRIPTION

Figure 1:
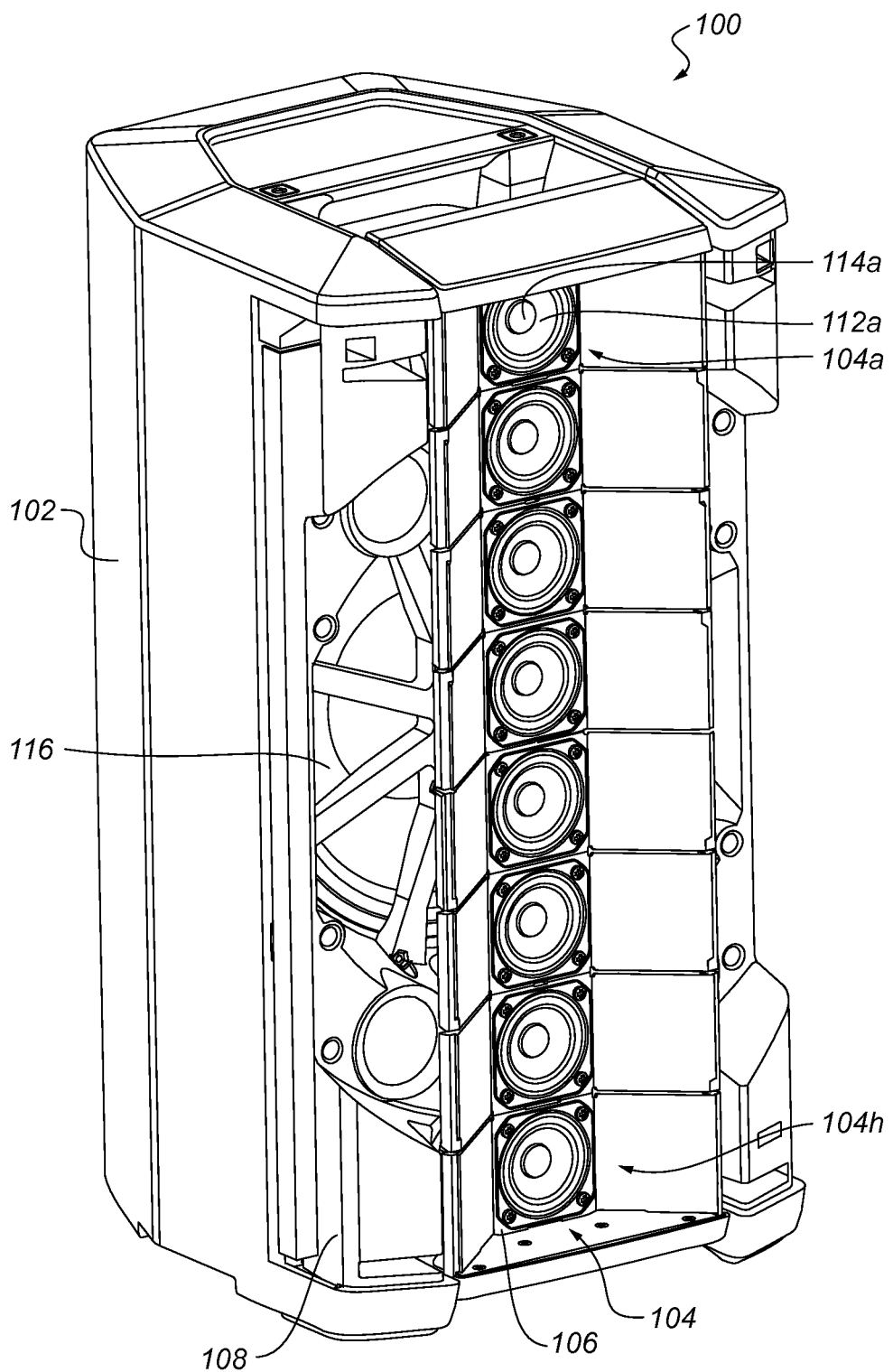
FIG. 1 is a perspective view of an adjustable line array loudspeaker.

Referring to FIG. 1, a line array loudspeaker 100 includes a housing 102 (also referred to as an enclosure or cabinet) and a plurality of electro-acoustic drivers 104 coupled to a flexible panel 106, which may be coupled to a mounting bracket 108 within the housing 102. Each electro-acoustic driver 104 typically includes a motor structure (not shown) mechanically coupled to a radiating component, such as a diaphragm, cone, dome, or other surface (for example, cone 112a on driver 104a in FIG. 1). Attached to the inner edge of the cone may be a dust cover or dust cap, which also may be dome-shaped (for example, dust cap 114a on driver 104a in FIG. 1). In operation, the motor structure operates as a linear motor, causing the radiating surface to vibrate along an axis of motion. This movement causes changes in air pressure, which results in the production of sound. Although eight electro-acoustic drivers are shown in FIG. 1, any number of drivers could be used. In some examples, a grille (also referred to as a protective screen) may be provided in front of the electro-acoustic drivers 104 to protect the electro-acoustic drivers.

The electro-acoustic drivers 104 may be mid-high or high frequency drivers, typically having an operating range of approximately 200 Hz to 16 kHz. The line array loudspeaker 100 may be configured to operate with a bass module (also referred to as a subwoofer or low frequency driver). In some examples, a low frequency driver 116 is disposed within the housing 102 of the line array loudspeaker 100, behind the plurality of electro-acoustic drivers 104. The mounting bracket 108 may have a bass port with a series of baffles in the center or other portion of the bracket for housing the low frequency driver 116. The low frequency driver 116 may have an operating range of approximately 50 Hz to 200 Hz. Alternatively, one or more bass modules may be provided external to the line array loudspeaker 100. In other applications, the electro-acoustic drivers 104 in the line array loudspeaker 100 may be of numerous types, including but not limited to compression drivers, cone drivers, mid-range drivers, full-range drivers, and tweeters, and may be coupled to an acoustic horn.

The flexible panel 106 and electro-acoustic drivers 104 may be configured to be curved into a number of configurations. More specifically, the flexible panel 106 and electro-acoustic drivers 104 can be positioned to be in a substantially straight configuration (as shown in FIG. 1) such that an axis that runs through the acoustic centers of the drivers 104 is a substantially straight line. The acoustic centers of the drivers 104 may be approximately at each driver's dust cap 114. Alternatively, the flexible panel 106 and electro-acoustic drivers 104 can be positioned to be in an arcuate configuration, as will be further described below. In an arcuate configuration, an axis that runs through the acoustic centers of the drivers 104 is curved in, for example, a J-shape, reverse J-shape, or C-shape. One such system for curving the electro-acoustic drivers 104 of the line array loudspeaker 100 is described in U.S. patent application Ser. No. 14/246,388, titled "Curvable Line Array" filed on Apr. 7, 2014, the entire contents of which are incorporated herein by reference. As described in that application, the flexible panel 106 and electro-acoustic drivers 104 may be adjusted by moving one or more mechanically adjustable points provided at opposite ends of the flexible panel (while the center of the flexible panel is fixed) or by moving one or more mechanically adjustable points provided along the interior of the flexible panel (while the ends of the flexible panel are fixed). For example, the flexible panel 106 and electro-acoustic drivers 104 may be moved via one or more adjustment handles positioned at or near the mechanically adjustable points.

Figure 2A:
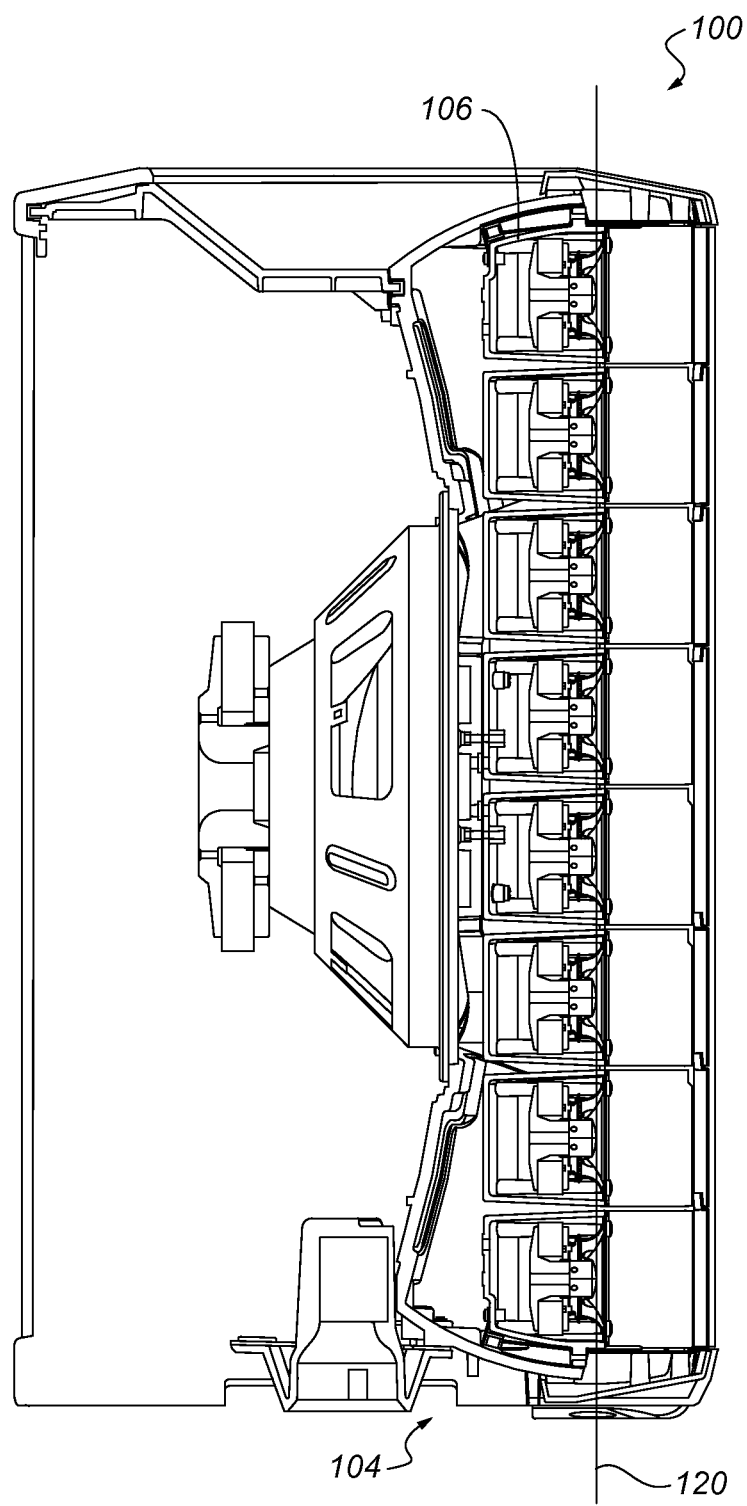
FIG. 2A is a side sectional view of the loudspeaker of FIG. 1 with the line array configured in a substantially straight line.

Several configurations of the line array loudspeaker 100 are shown in FIGS. 2A through 2D. FIG. 2A shows a side view of the line array loudspeaker 100 when the flexible panel 106 electro-acoustic drivers 104 are in a substantially straight line. As shown in FIG. 2A, an axis 120 that runs through the acoustic centers of the drivers 104 (approximately at each driver's dust cap) is a substantially straight line. A substantially straight configuration provides tight vertical control and high sound pressure level (SPL) and may be suitable when an audience is situated on a single plane, for example at live music performance venues.

Figure 2B:
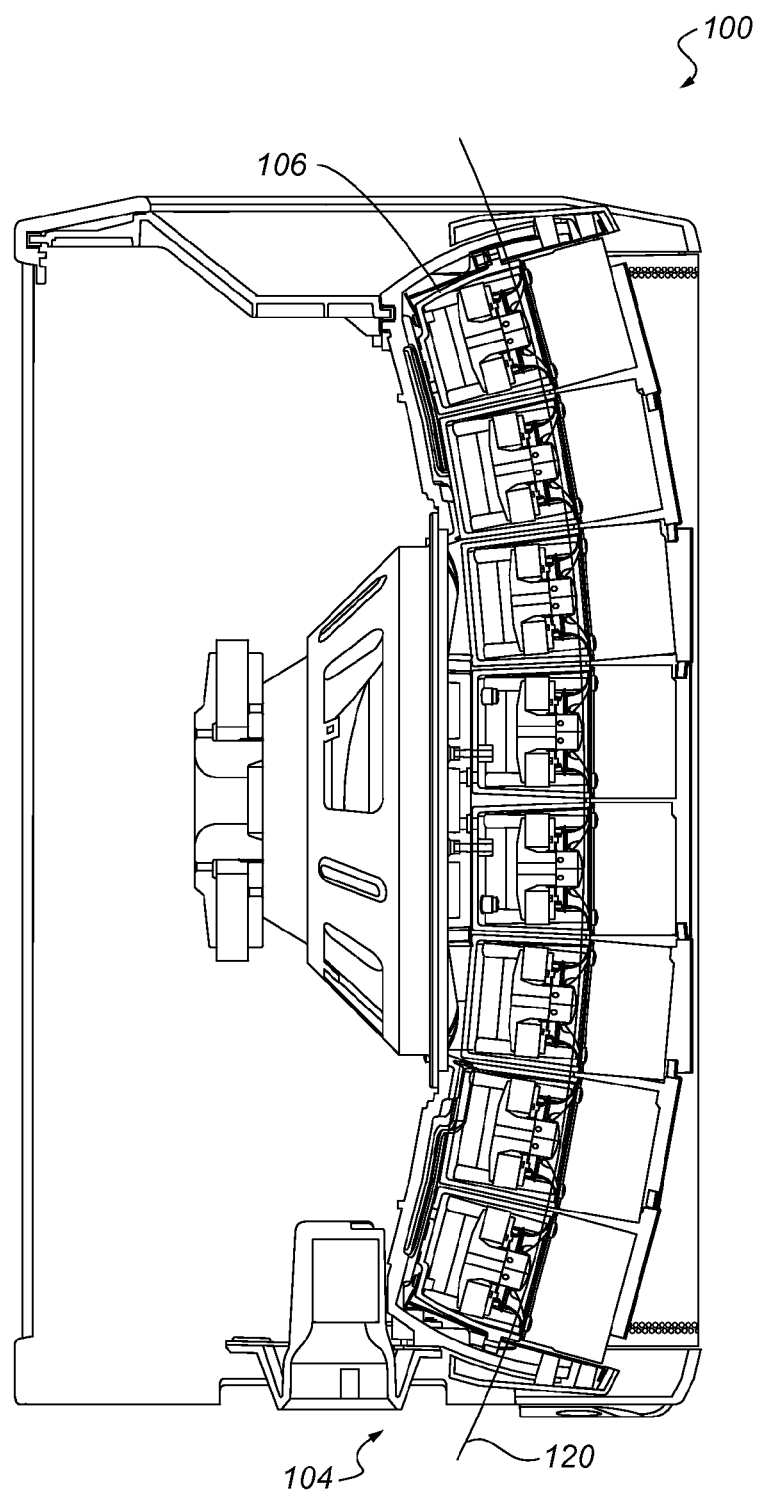
FIG. 2B is a side sectional view of the loudspeaker of FIG. 1 with the line array configured in a C-shape.

FIG. 2B shows a side view of the line array loudspeaker 100 when the flexible panel 106 and electro-acoustic drivers 104 are positioned to create a C-shaped curve. As shown in FIG. 2B, an axis 120 that runs through the acoustic centers of the drivers 104 (approximately at each driver's dust cap) is curved in a C-shape that is convex when viewed from the front of the line array loudspeaker 100. In other examples, the C-shape could be concave when viewed from the front of the loudspeaker. A C-shaped configuration increases the vertical dispersion of the line array loudspeaker 100 at both ends of the loudspeaker, and may be suitable for venues in which the floor has extreme "raked" seating (i.e., the floor is not a single horizontal plane, but rather is an inclined plane or a series of multiple horizontal stepped planes or tiers).

Figure 2C:
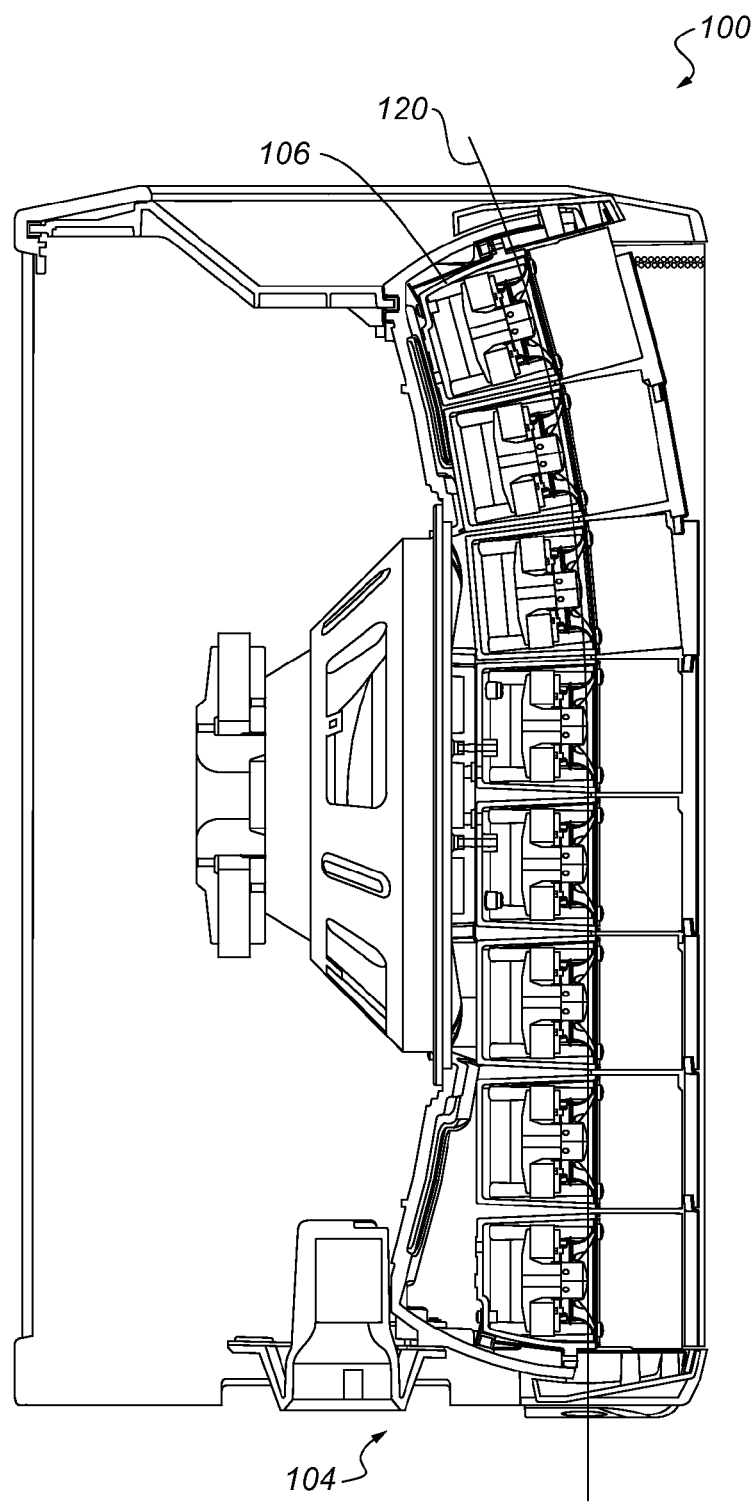
FIG. 2C is a side sectional view of the loudspeaker of FIG. 1 with the line array configured in a reverse J-shape.

FIG. 2C shows a side view of the line array loudspeaker 100 when the flexible panel 106 and electro-acoustic drivers 104 are positioned to create a reverse J-shaped curve. As shown in FIG. 2C, an axis 120 that runs through the acoustic centers of the drivers 104 (approximately at each driver's dust cap) is curved in a reverse J-shape, where the top of the flexible panel 106 curves away from the front plane of the line array loudspeaker 100. In other examples, the top of the flexible panel 106 could be curved toward the front plane of the line array loudspeaker 100. A reverse J-shaped configuration increases the vertical dispersion of the line array loudspeaker 100 at the top of the loudspeaker, and may be suitable for venues having balconies or other seating that is located above the main floor.

Figure 2D:
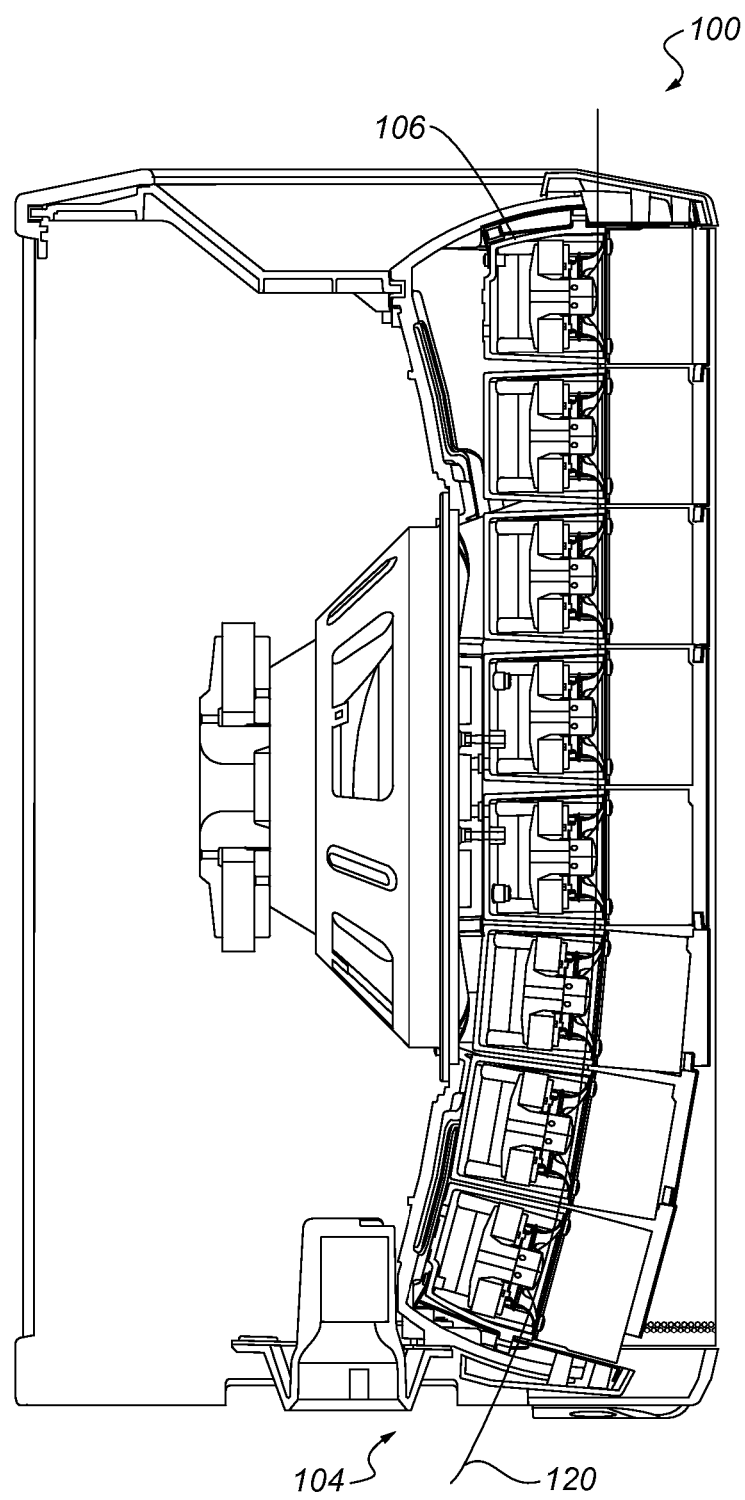
FIG. 2D is a side sectional view of the loudspeaker of FIG. 1 with the line array configured in a J-shape.

FIG. 2D shows a side view of the line array loudspeaker 100 when the flexible panel 106 and electro-acoustic drivers 104 are positioned to create a J-shaped curve. As shown in FIG. 2D, an axis 120 that runs through the acoustic centers of the drivers 104 (approximately at each driver's dust cap) is curved in a J-shape, where the bottom of the flexible panel 106 curves away from the front plane of the line array loudspeaker 100. In other examples, the bottom of the flexible panel 106 could be curved toward the front plane of the line array loudspeaker 100. A J-shaped configuration increases the vertical dispersion of the line array loudspeaker 100 at the bottom of the loudspeaker, and may be suitable for venues having inclined or raked seating.

In some examples, the flexible panel 106 is adjustable from the substantially straight configuration to a single position at each end of the flexible panel 106 (or to a single position along the interior of the flexible panel). Alternatively, the flexible panel 106 is adjustable from the substantially straight configuration to multiple positions at each end of the flexible panel (or to multiple positions along the interior of the flexible panel). In some examples, stop points could be provided at certain intervals, for example every 5 degrees, to enable multiple adjustment points. Any number of adjustment angles having any number of values could be provided.

Figure 3:
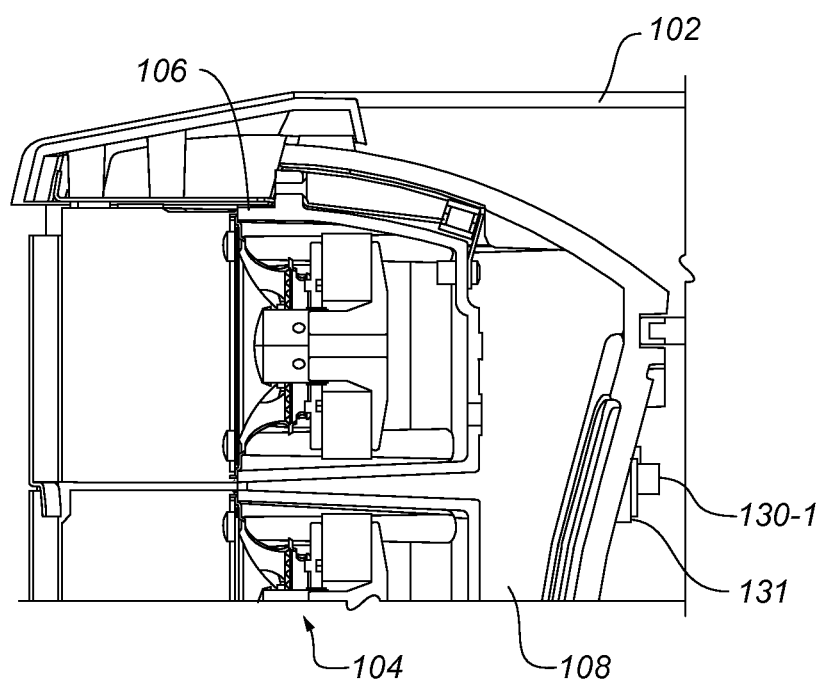
FIG. 3 is a partial side sectional view of the adjustable line array loudspeaker of FIG. 1.
Figure 4:
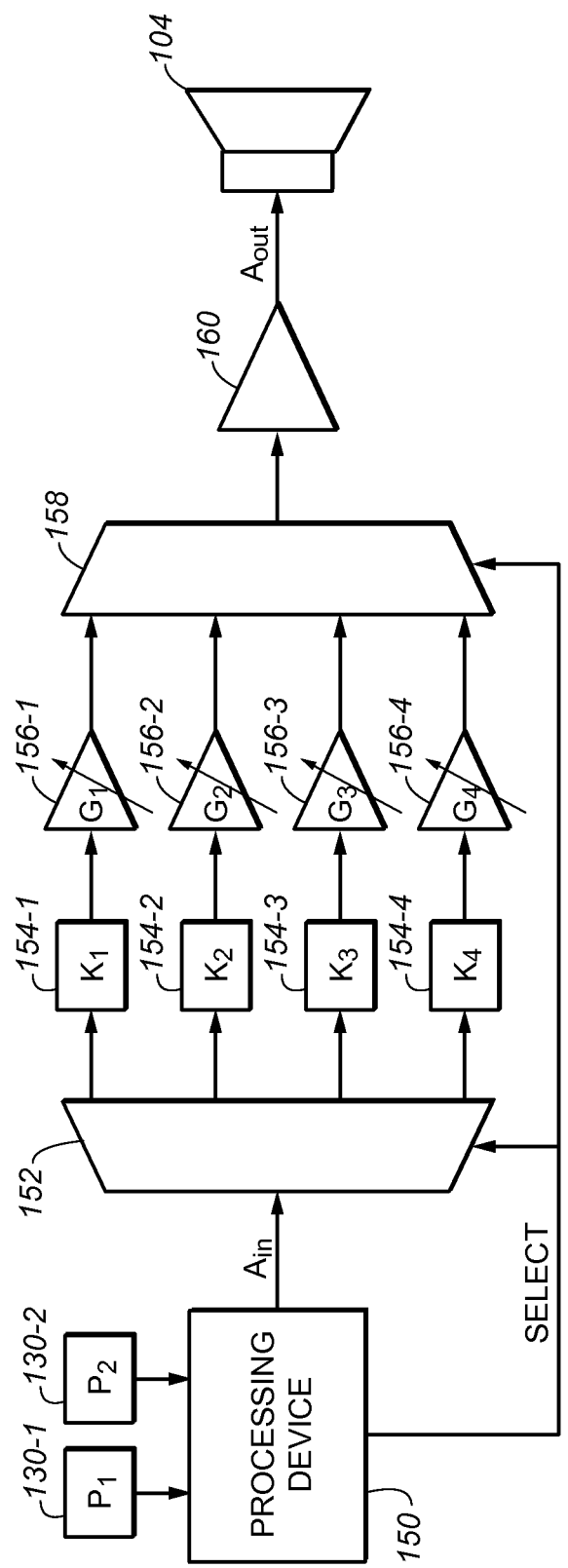
FIG. 4 shows circuits for implementing the loudspeaker of FIGS. 1 through 3.

Referring to FIGS. 3 and 4, the line array loudspeaker 100 may be configured to determine that the flexible panel 106 and electro-acoustic drivers 104 are in a particular configuration, and to adjust the audio signal output from the loudspeaker based on the detected configuration. When the configuration of the line array loudspeaker 100 is adjusted, the natural room response of the loudspeaker changes. So if no corresponding adjustments are made to the audio signal being output from the line array loudspeaker 100, that signal will sound different to a listener depending on the configuration. For example, in the substantially straight configuration of FIG. 2A, there is high sound pressure level (SPL) with a high level of high frequency radiation being directed at a listening location. In the arcuate configurations, however, a listening location may receive less high frequency radiation and the sound being output may be at a lower SPL as compared to when the line array loudspeaker 100 is in the substantially straight configuration. To compensate for these differences, various adjustments can be made to the audio signal based on the configuration of the loudspeaker, including equalization and/or volume adjustments. With one or more of these adjustments, the audio being output from the line array loudspeaker 100 may sound substantially the same regardless of the configuration of the line array loudspeaker 100.

Referring to FIG. 3, the line array loudspeaker 100 may include one or more position sensors 130 for detecting that the position of the flexible panel 106 and drivers 104 have changed. In FIG. 3, position sensor 130-1 is coupled to one end of the flexible panel 106, and a second position sensor 130-2 (not shown) could be coupled to the opposite end of the flexible panel 106. However, the position sensors could be in other locations along the length of the flexible panel. In general, the position sensors 130 should be positioned to coincide with the mechanically adjustable points on the flexible panel 106. For example, if the flexible panel 106 is adjustable along the interior of the panel (e.g., at the center), a position sensor 130 could be provided at or near the center of the flexible panel. The position sensors could comprise any suitable sensor, including but not limited to a magnetic sensor, infrared sensor, photoelectric sensor, capacitive sensor, inductive sensor, Reed sensor, Hall effect sensor, contact switch, or any combination thereof. When the position of the flexible panel 106 and drivers 104 changes from, for example, a substantially straight configuration to an arcuate configuration, the position sensors detect the change, and send a signal to a processing device (not shown in FIG. 3) to communicate the new configuration of the loudspeaker. Similarly, when the position of the flexible panel 106 and drivers 104 changes from an arcuate configuration to a substantially straight configuration, the position sensors detect the change, and send a signal to the processing device to communicate the new configuration.

In the example where the flexible panel 106 can be adjusted from the substantially straight configuration to a single position at each end of the flexible panel 106, one position sensor 130-1, 130-2 is provided at each end of the flexible panel 106 (or near enough to each end of the flexible panel that a change in position of the flexible panel would be detected by the position sensors). The position sensors 130-1, 130-2 may be mounted on a printed circuit board (PCB) 131, which in turn is mounted to the mounting bracket 108 near the top-most driver 104a and bottom-most driver 104h, respectively. The PCB 131 is connected to a processing device (not shown) via a wired or wireless connection. When the flexible panel 106 and acoustic drivers 104 are in a substantially straight configuration, the position sensors 130-1, 130-2 are not engaged, so the processing device receives signals indicating that both ends of the flexible panel 106 are in a straight configuration. When the flexible panel 106 and acoustic drivers 104 are in the C-shaped configuration of FIG. 2B, both position sensors 130-1, 130-2 are engaged, so the processing device receives signals indicating that both ends of the flexible panel 106 are in an arcuate configuration. When the flexible panel 106 and acoustic drivers 104 are in the reverse J-shaped configuration of FIG. 2C, only the top position sensor 130-1 is engaged, so the processing device receives signals indicating that the top end of the flexible 106 is in an arcuate configuration, while the bottom end of the flexible panel 106 is in a straight configuration. When the flexible panel 106 and acoustic drivers 104 are in the J-shaped configuration of FIG. 2D, only the bottom position sensor 130-2 is engaged, so the processing device receives signals indicating that the bottom end of the flexible panel 106 is in an arcuate configuration, while the top end of the flexible panel 106 is in a straight configuration.

In one example, the position sensors 130-1, 130-2 comprise Hall effect sensors, which generally operate to vary their voltage in response to a magnetic field. In this example, the line array loudspeaker 100 may include one or more magnets 132-1, 132-2 for securing the flexible panel 106 into a particular configuration, as described in the above-referenced U.S. patent application Ser. No. 14/246,388. When the configuration of the line array loudspeaker 100 is changed from, for example, a straight configuration to a C-shaped configuration, the flexible panel 106 is curved and the magnets 132-1, 132-2 move towards the sensors 130-1, 130-2. As such, the magnets 132-1, 132-2 create magnetic fields that are detected by the sensors 130-1, 130-2, and the sensors 130-1, 130-2 output a signal indicating the flexible panel 106 is in a C-shaped configuration. When the line array loudspeaker 100 is changed back to a straight configuration, the magnets 132-1, 132-2 move away from the sensors 130-1, 130-2, so that a magnetic field is no longer detected by the sensors 130-1, 130-2. Thus, the sensors 130-1, 130-2 output a signal indicating the flexible panel 106 is in a straight configuration. With a Hall effect sensor, magnets contained within the electro-acoustic drivers 104 could also be used to detect a change in position. In other examples, other types of sensors, such as infrared sensors, photoelectric sensors, capacitive sensors, inductive sensors, Reed sensors, magnetic sensors, contact switches, or any combination thereof, could be used in ways known to those of skill in the art.

Referring to FIG. 4, circuitry in the loudspeaker processes the signals from each position sensor 130-1, 130-2 to automatically adjust the equalization and volume of the audio signal output from the loudspeaker based on the detected configuration of the loudspeaker. The circuitry may be implemented with discrete electronics, by software code running on a digital signal processor (DSP) or any other suitable processor within or in communication with the loudspeaker. Although the circuitry in FIG. 4 is shown as automatically adjusting equalization and volume of the audio signal, it should be understood that the circuitry could be modified to adjust one of equalization and volume.

As shown in FIG. 4, a processing device 150 receives signals from the position sensors 130-1, 130-2 indicating the configuration of the loudspeaker, which can be, for example, substantially straight, J-shaped, reverse J-shaped or C-shaped. The processing device then communicates the audio signal ($A_{in}$) to be output from the line array loudspeaker 100 along with control signals indicating the configuration of the loudspeaker ("Select") to a demultiplexer 152, which routes the audio signal to an equalization stage 154 and gain stage 156. After passing through the equalization and gain stages, the audio signal is routed through a multiplexer 158, which sends the signal to an amplification stage 160, which amplifies the signal before it is output through the loudspeaker drivers 104 ($A_{out}$).

The equalization stage 154 and gain stage 156 are selected based on the configuration of the loudspeaker. For example, if the loudspeaker is in a substantially straight configuration, the audio signal is routed to equalization stage 154-1 and gain stage 156-1; if the loudspeaker is in a C-shaped configuration, the audio signal is routed to equalization stage 154-2 and gain stage 156-2; if the loudspeaker is in a reverse J-shaped configuration, the audio signal is routed to equalization stage 154-3 and gain stage 156-3; and if the loudspeaker is in a J-shaped configuration, the audio signal is routed to equalization stage 154-4 and gain stage 154-4. While FIG. 4 shows a different equalization stage 154 and gain stage 156 for each of the four configurations, it should be understood that multiple configurations could share the same equalization stage 154 and gain stage 156. For example, the J-shaped configuration and reverse J-shaped configuration could be configured to employ the same equalization and volume adjustments.

Each equalization stage 154 applies an appropriate equalization to the audio signal ($A_{in}$) based on the detected configuration. As known to those of skill in the art, equalization is a process that alters the frequency response of an audio signal using filters. The equalization stages 154 may adjust the filter parameters applied to the audio signal to adjust the amplitude of the audio signal $A_{in}$ at particular frequencies. The equalization applied to the audio signal $A_{in}$ may be pre-determined for the four configurations (substantially straight, C-shaped, reverse J-shaped, and J-shaped) or it may be determined based on acoustic measurements of the frequency response of the line array loudspeaker 100 in the various configurations in the particular venue in which the line array loudspeaker 100 is being used.

To make the transition from one set of equalization parameters to a second set of equalization parameters more seamless, a crossfading algorithm may be applied in the equalization stages 154. The algorithm may crossfade one set of equalization filter parameters to a second set of equalization filter parameters over a predetermined period of time, for example 1 millisecond to 1 second. Transitioning to a new set of equalization filter parameters without a crossfading algorithm can lead to an audible click in the audio output from the line array loudspeaker 100. Applying the crossfading algorithm eliminates this click.

Each gain stage 156 applies an appropriate volume to the audio signal based on the detected configuration. The volume applied to the audio signal may be pre-determined for the four configurations (substantially straight, C-shaped, reverse J-shaped, and J-shaped) or it may be determined based on acoustic measurements of the frequency response of the line array loudspeaker 100 in the various configurations in the particular venue in which the line array loudspeaker 100 is being used. As with the equalization stages 154, the gain stages 156 may utilize a crossfading algorithm to crossfade one volume setting to a second volume setting over a predetermined period of time, for example 1 millisecond to 1 second. Applying the crossfading algorithm to the volume adjustment makes the adjustments to the audio signal more seamless to a listener.

Figure 5:
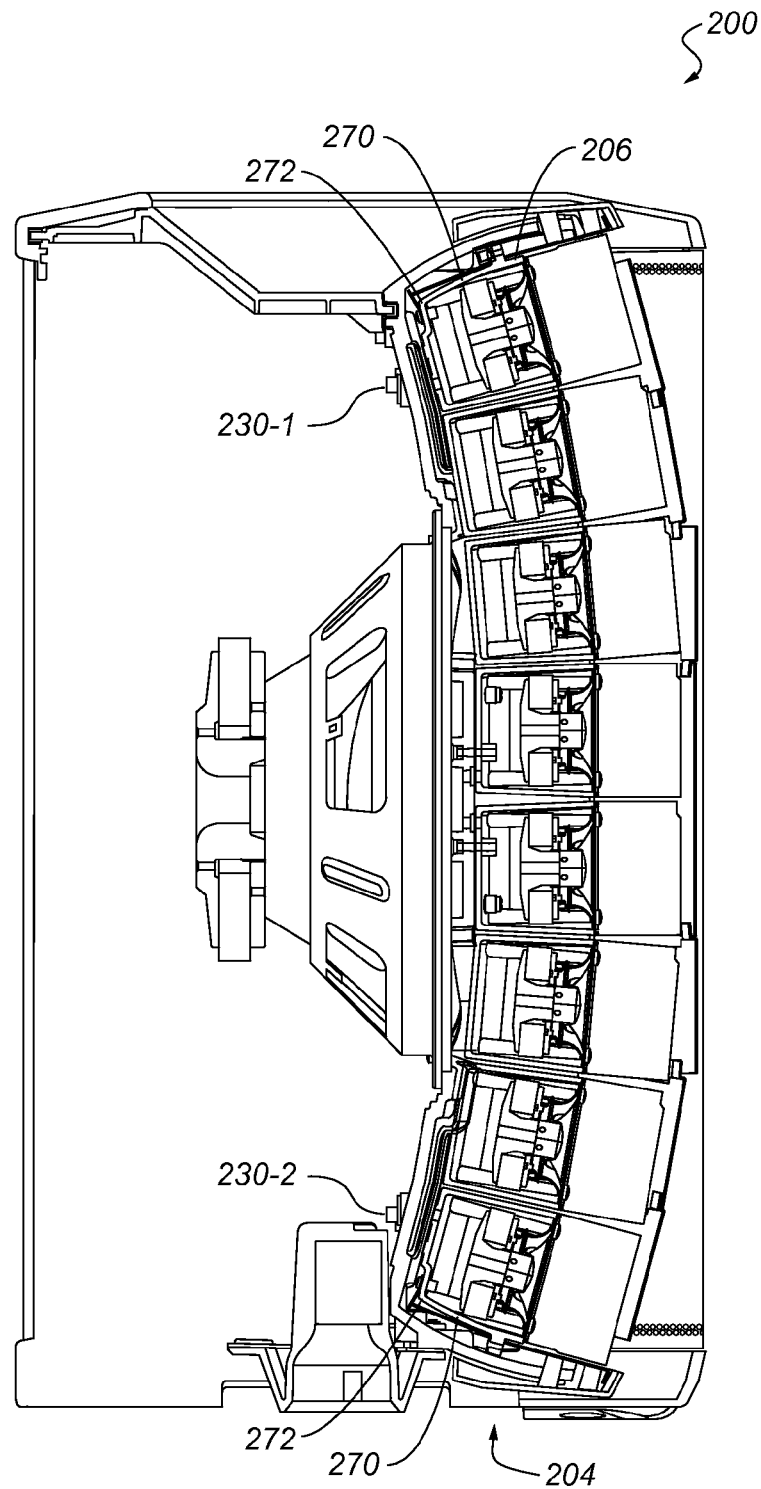
FIG. 5 shows a perspective view of another example of an adjustable line array loudspeaker.

Referring to FIG. 5, in the example where the flexible panel 206 can be adjusted from the substantially straight configuration to multiple positions at each end of the flexible panel 206, one or more position sensors 230-1, 230-2, 230-n are provided at each end of the flexible panel (or near enough to each end of the flexible panel that a change in position of the flexible panel would be detected by the position sensors). Each position sensor is connected to a processing device via a wired or wireless connection. The position sensors 230 operate in a similar manner to the example where the flexible panel can be adjusted from the substantially straight configuration to a single position at each end of the flexible panel.

Multiple position sensors could be provided at each end of the flexible panel for each stop point or angle to which the flexible panel could be adjusted. For example, if stop points are provided at two positions 270, 272 at each end of the flexible panel 206 (in addition to the substantially straight configuration), position sensors 230-1, 230-2, 230-3, 230-4 may be provided at each of the positions 270, 272. Thus, when the flexible panel 206 and acoustic drivers 204 are in a substantially straight configuration, the position sensors 230-1, 230-2, 230-3 and 230-4 are not engaged, so the processing device receives signals indicating that both ends of the flexible panel 206 are in a straight configuration.

When the flexible panel 206 and acoustic drivers 204 are in the C-shaped configuration at position 270, both position sensors 230-1, 230-2 are engaged, so the processing device receives signals indicating that both ends of the flexible panel 206 are in an arcuate configuration at position 270. Similarly, when the flexible panel 206 and acoustic drivers 204 are in the C-shaped configuration at position 272, both position sensors 230-3, 230-4 are engaged, so the processing device receives signals indicating both ends of the flexible panel 206 are in an arcuate configuration at position 272. The position sensors 230 operate similarly for the multiple J-shaped and reverse J-shaped configurations that are possible. It should be understood that although two positions 270, 272 are shown in FIG. 5, any number of adjustment points could be provided at each end of the flexible panel 206. Alternatively, as shown in FIG. 5, a single position sensor 230-1, 230-2 could be provided on each end of the flexible panel 206, so long as each sensor 230 is sensitive enough to detect each of the possible adjustment positions. Suitable sensors include but are not limited to infrared sensors, photoelectric sensors, capacitive sensors, inductive sensors, Reed sensors, magnetic sensors, contact switches, or any combination thereof.

Figure 6:
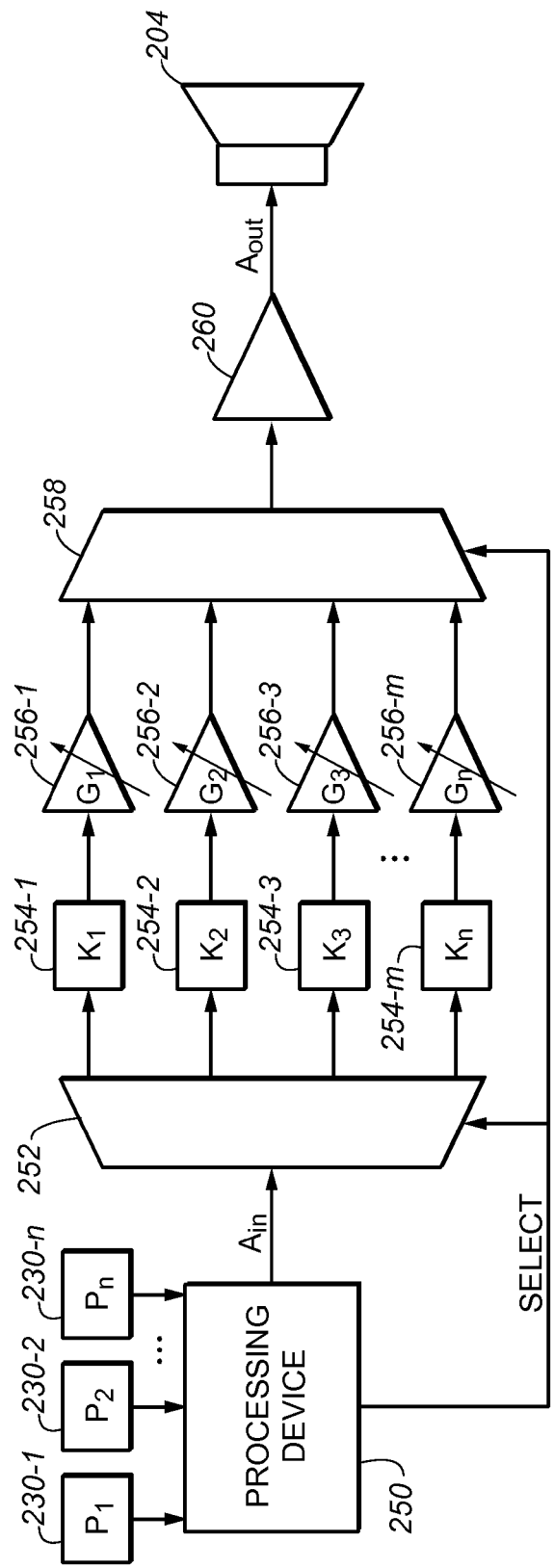
FIG. 6 shows circuits for implementing the loudspeaker of FIG. 5.

Referring to FIG. 6, circuitry in the loudspeaker processes the signals from each position sensor 230-1, 230-2, 230-n to automatically adjust the equalization and volume of the audio signal output from the loudspeaker based on the detected configuration of the loudspeaker. The circuitry of FIG. 6 operates in a similar manner to the example where the flexible panel 206 can be adjusted from the substantially straight configuration to a single position at each end of the flexible panel 206 (FIG. 4). First, a processing device 250 receives signals from the position sensors 230-1, 230-2, 230-n indicating the configuration of the loudspeaker. The processing device then communicates the audio signal ($A_{in}$) to be output from the line array loudspeaker 200 along with control signals indicating the configuration of the loudspeaker ("Select") to a demultiplexer 252, which routes the audio signal to an equalization stage 254 and gain stage 256. After passing through the equalization and gain stages, the audio signal is routed through a multiplexer 258, which sends the signal to an amplification stage 260, which amplifies the signal before it is output through the loudspeaker drivers 204 ($A_{out}$). Although the circuitry in FIG. 6 is shown as automatically adjusting equalization and volume of the audio signal, it should be understood that the circuitry could be modified to adjust one of equalization and volume.

The equalization stage 254 and gain stage 256 are selected based on the configuration of the loudspeaker. For example, if the loudspeaker is in the substantially straight configuration, the audio signal may be routed to equalization stage 254-1 and gain stage 256-1; if the loudspeaker is in the C-shaped configuration at position 270, the audio signal may be routed to equalization stage 254-2 and gain stage 256-2; and if the loudspeaker is in the C-shaped configuration at position 272, the audio signal may be routed to equalization stage 254-3 and gain stage 256-3. Other possible configurations would be similarly routed through different equalization stages 254 and gain stages 256. It should be understood that multiple configurations could share the same equalization stage 254 and gain stage 256. For example, the J-shaped configuration (with one end of the flexible panel 206 at position 270) and reverse J-shaped configuration (with the other end of the flexible panel 206 at position 270) could be configured to employ the same equalization and volume adjustments.

Each equalization stage 254 applies an appropriate equalization to the audio signal ($A_{in}$) based on the detected configuration. The equalization applied to the audio signal $A_{in}$ may be pre-determined for the various configurations or it may be determined based on acoustic measurements of the frequency response of the line array loudspeaker 200 in the various configurations in the particular venue in which the line array loudspeaker 200 is being used. As previously described, a crossfading algorithm may be applied in the equalization stage 254 to crossfade one set of equalization filter parameters to a second set of equalization filter parameters over a predetermined period of time (e.g., 1 millisecond to 1 second).

Each gain stage 256 applies an appropriate volume to the audio signal based on the detected configuration. The volume applied to the audio signal may be pre-determined for the various configurations or it may be determined based on acoustic measurements of the frequency response of the line array loudspeaker 200 in the various configurations in the particular venue in which the line array loudspeaker 200 is being used. A previously described, a crossfading algorithm may be applied to crossfade one volume setting to a second volume setting over a predetermined period of time (e.g., 1 millisecond to 1 second).

In the various examples of the loudspeaker discussed with reference to FIGS. 1 through 6, the loudspeaker can be lengthened by providing multiple loudspeaker modules that can be attached to create a longer loudspeaker. One such system for stacking multiple loudspeaker modules is described in the above-referenced U.S. patent application Ser. No. 14/246,388. In the case where multiple loudspeaker modules are stacked, one or more position sensors in the loudspeaker modules detect the configuration of the stacked loudspeaker, and circuitry within or in communication with the loudspeaker automatically adjusts the equalization and/or volume applied to the audio signal based on the detected position.

By providing a loudspeaker system that delivers an adjustable acoustic coverage with automatically adjustable equalization and/or volume settings, the system can be tailored to a particular venue and can reach larger portions of an audience, with consistent sound output across various configurations.

The various examples of the loudspeaker discussed herein may be used in installed or portable sound systems, for example, in schools, auditoria, houses of worship, meeting rooms, or live performance venues. The loudspeaker may be oriented vertically or non-vertically, for example non-perpendicular to the floor or horizontally. The loudspeaker could be wall-mounted or freestanding.

Examples of the systems and methods described above may comprise computer components and computer-implemented steps that will be apparent to those skilled in the art. For example, it should be understood by one of skill in the art that any computer-implemented steps may be stored as computer-executable instructions on a computer-readable medium such as, for example, Flash ROMS, nonvolatile ROM, and RAM. Furthermore, it should be understood by one of skill in the art that the computer-executable instructions may be executed on a variety of processors such as, for example, microprocessors, digital signal processors, gate arrays, etc. For ease of exposition, not every step or element of the systems and methods described above is described herein as part of a computer system, but those skilled in the art will recognize that each step or element may have a corresponding computer system or software component.

A number of implementations have been described. Nevertheless, it will be understood that additional modifications may be made without departing from the scope of the inventive concepts described herein, and, accordingly, other embodiments are within the scope of the following claims.

What is claimed is:

1. A loudspeaker comprising:
a plurality of electro-acoustic drivers configured to be positioned so that an axis running through an acoustic center of the electro-acoustic drivers is one of a substantially straight line, J-shape, reverse J-shape, and C-shape;
at least one sensor to detect a configuration of the plurality of electro-acoustic drivers; and
a processing device configured to automatically adjust one or more of an equalization and a gain applied to an audio signal output through the electro-acoustic drivers based on the detected configuration.

2. The loudspeaker of claim 1, wherein the processing device is configured to adjust the equalization by crossfading a first set of filter parameters to a second set of filter parameters over a predetermined period of time.

3. The loudspeaker of claim 1, wherein the processing device is configured to automatically adjust both the equalization and the gain applied to the audio signal based on the detected configuration.

4. The loudspeaker of claim 1, wherein the processing device is configured to adjust the gain by crossfading a first gain to a second gain over a predetermined period of time.

5. The loudspeaker of claim 1, wherein the acoustic center of each electro-acoustic driver is the center of a dust cap disposed on each electro-acoustic driver.

6. The loudspeaker of claim 1, wherein the at least one sensor comprises at least one of: an infrared sensor, photoelectric sensor, magnetic sensor, capacitive sensor, inductive sensor, Reed sensor, Hall effect sensor, and contact switch.

7. The loudspeaker of claim 1, wherein the equalization applied to the audio signal is predetermined based on a configuration of the electro-acoustic drivers.

8. The loudspeaker of claim 1, wherein the equalization applied to the audio signal is determined based on an acoustic measurement of a frequency response of the loudspeaker.

9. The loudspeaker of claim 1, wherein the equalization and gain are automatically adjusted so that the audio signal sounds substantially the same regardless of the configuration of the electro-acoustic drivers.

10. A loudspeaker system comprising:
a first loudspeaker array comprising:
a first housing;
a first plurality of electro-acoustic drivers disposed in the first housing, wherein the first plurality of electro-acoustic drivers is configured to be positioned so that an axis running through an acoustic center of the electro-acoustic drivers is one of a substantially straight line, J-shape, reverse J-shape, and C-shape;
at least one sensor disposed in the first housing to detect a configuration of the first plurality of electro-acoustic drivers; and
a first processing device configured to automatically adjust one or more of an equalization and a gain applied to an audio signal output through the first plurality of electro-acoustic drivers based on the detected configuration.

11. The loudspeaker system of claim 10, wherein the first processing device is configured to adjust the equalization by crossfading a first set of filter parameters to a second set of filter parameters over a predetermined period of time.

12. The loudspeaker system of claim 10, wherein the first processing device is further configured to automatically adjust both the equalization and the gain applied to the audio signal based on the detected configuration.

13. The loudspeaker system of claim 10, wherein the first processing device is configured to adjust the gain by crossfading a first gain to a second gain over a predetermined period of time.

14. The loudspeaker system of claim 10, wherein the acoustic center of each electro-acoustic driver is the center of a dust cap disposed on each electro-acoustic driver.

15. The loudspeaker system of claim 10, wherein the at least one sensor disposed in the first housing comprises at least one of: an infrared sensor, photoelectric sensor, magnetic sensor, capacitive sensor, inductive sensor, Reed sensor, Hall effect sensor, and contact switch.

16. The loudspeaker system of claim 10, wherein the equalization applied to the audio signal is predetermined based on the configuration of the electro-acoustic drivers.

17. The loudspeaker system of claim 10, wherein the equalization applied to the audio signal is determined based on an acoustic measurement of a frequency response of the loudspeaker.

18. The loudspeaker system of claim 10, wherein the equalization and gain are automatically adjusted so that the audio signal sounds substantially the same regardless of the configuration of the electro-acoustic drivers.

19. The loudspeaker system of claim 10, further comprising:
a second loudspeaker array comprising:
a second housing;
a second plurality of electro-acoustic drivers disposed in the second housing, wherein the second plurality of electro-acoustic drivers is configured to be positioned so that the axis running through an acoustic center of the electro-acoustic drivers is one of a substantially straight line, J-shape, reverse J-shape, and C-shape;
at least one sensor disposed in the second housing to detect the configuration of the second plurality of electro-acoustic drivers; and
a second processing device configured to automatically adjust one or more of the equalization and the gain applied to an audio signal output through the second plurality of electro-acoustic drivers based on the detected configuration,
wherein the second loudspeaker array is configured to be attached to the first loudspeaker array in a manner that extends a height of the loudspeaker system while a width remains substantially the same.

20. A method comprising:
providing a plurality of electro-acoustic drivers configured to be positioned so that an axis running through an acoustic center of the electro-acoustic drivers is one of a substantially straight line, J-shape, reverse J-shape, and C-shape;
detecting a configuration of the plurality of electro-acoustic drivers; and
automatically adjusting one or more of an equalization and a gain applied to an audio signal output through the plurality of electro-acoustic drivers based on the detected configuration.

21. The method of claim 20, wherein automatically adjusting the equalization comprises crossfading a first set of filter parameters to a second set of filter parameters over a predetermined period of time.

22. The method of claim 20, further comprising automatically adjusting both the equalization and the gain applied to the audio signal based on the detected configuration.

23. The method of claim 20, wherein automatically adjusting the gain comprises crossfading a first gain to a second gain over a predetermined period of time.

24. The method of claim 20, wherein detecting the configuration uses at least one of: an infrared sensor, photoelectric sensor, magnetic sensor, capacitive sensor, inductive sensor, Reed sensor, Hall effect sensor, and contact switch.

25. The method of claim 20, wherein the equalization and gain are automatically adjusted so that the audio signal sounds substantially the same regardless of the configuration of the electro-acoustic drivers.

* * * * *